United States Patent
Ko

(10) Patent No.: US 8,698,300 B2
(45) Date of Patent: Apr. 15, 2014

(54) CHIP-STACKED SEMICONDUCTOR PACKAGE

(75) Inventor: Ji-han Ko, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 13/450,975

(22) Filed: Apr. 19, 2012

(65) Prior Publication Data

US 2013/0009304 A1    Jan. 10, 2013

(30) Foreign Application Priority Data

Jul. 4, 2011    (KR) .......................... 10-2011-0066127

(51) Int. Cl.
*H01L 23/02*    (2006.01)

(52) U.S. Cl.
USPC .......................................... 257/686; 257/777

(58) Field of Classification Search
USPC ...................... 257/686, 777, 723, 724, 778
See application file for complete search history.

(56) References Cited

U.S. PATENT DOCUMENTS

| | | | |
|---|---|---|---|
| 5,776,797 A * | 7/1998 | Nicewarner et al. | 438/107 |
| 6,225,688 B1 * | 5/2001 | Kim et al. | 257/686 |
| 6,927,497 B2 * | 8/2005 | Meyers | 257/777 |
| 6,977,441 B2 * | 12/2005 | Hashimoto | 257/777 |
| 7,122,886 B2 * | 10/2006 | Murayama et al. | 257/686 |
| 7,989,943 B2 | 8/2011 | Kim et al. | |
| 8,421,203 B2 * | 4/2013 | Chi et al. | 257/687 |
| 8,525,322 B1 * | 9/2013 | Kim et al. | 257/691 |
| 2004/0099938 A1 * | 5/2004 | Kang et al. | 257/686 |
| 2006/0033217 A1 * | 2/2006 | Taggart et al. | 257/778 |
| 2010/0258929 A1 | 10/2010 | Kim et al. | |
| 2013/0119558 A1 * | 5/2013 | Hwang et al. | 257/774 |

FOREIGN PATENT DOCUMENTS

| | | |
|---|---|---|
| KR | 1020020028474 | 4/2002 |
| KR | 1020050120929 | 12/2005 |
| KR | 1020100112899 | 10/2010 |

* cited by examiner

*Primary Examiner* — S. V. Clark
(74) *Attorney, Agent, or Firm* — Onello & Mello, LLP

(57) ABSTRACT

A chip-stacked semiconductor package including a stacked chip structure including a plurality of separate chips stacked on each other; a flexible circuit substrate having the stacked chip structure mounted on a first side of the flexible circuit substrate in a first region of the flexible circuit substrate, and being electrically connected to at least one of the plurality of separate chips of the stacked chip structure by folding a second region of the flexible circuit substrate; a sealing portion sealing the stacked chip structure and the flexible circuit substrate; and an external connecting terminal on a second side of the flexible circuit substrate.

19 Claims, 13 Drawing Sheets

CHIP-STACKED SEMICONDUCTOR PACKAGE

CROSS-REFERENCE TO RELATED APPLICATIONS

This U.S. non-provisional patent application claims priority under 35 U.S.C. §119 to Korean Patent Application No. 10-2011-0066127, filed on Jul. 4, 2011, in the Korean Intellectual Property Office, the disclosure of which is herein incorporated by reference in its entirety.

BACKGROUND

The inventive concepts relate to a semiconductor package, and more particularly, to a chip-stacked semiconductor package in which a plurality of chips are stacked.

Requirements for small-sized, multifunctional, and high-capacity semiconductor products that have high reliability and can be manufactured with low costs have increased. Semiconductor packaging is an important technology for achieving such complex goals.

SUMMARY

The inventive concepts provide a chip-stacked semiconductor package that has a small size, various functions, and a high capacity.

According to an aspect of the inventive concepts, there is provided a chip-stacked semiconductor package including: a stacked chip structure including a plurality of separate chips stacked on each other; a flexible circuit substrate having the stacked chip structure mounted on a first side of the flexible circuit substrate in a first region of the flexible circuit substrate, and being electrically connected to at least one of the plurality of separate chips of the stacked chip structure by folding a second region of the flexible circuit substrate; a sealing portion sealing the stacked chip structure and the flexible circuit substrate; and an external connecting terminal on a second side of the flexible circuit substrate.

In one embodiment, the flexible circuit substrate and at least one of the plurality of separate chips of the stacked chip structure may be connected to each other by using a wire. In one embodiment, the plurality of separate chips of the stacked chip structure may be bonded to each other with an adhesive layer.

In one embodiment, the plurality of separate chips of the stacked chip structure may be stacked in a stair shape on the first side of the flexible circuit substrate. In one embodiment, at least one of the plurality of separate chips of the stacked chip structure may be stacked to cross the other ones of the plurality of separate chips on the flexible circuit substrate.

In one embodiment, the flexible circuit substrate may be electrically connected to at least one of the plurality of separate chips by folding both end portions of the flexible circuit substrate. In one embodiment, the flexible circuit substrate and at least one of the plurality of separate chips of the stacked chip structure may be connected to each other by using a wire.

In one embodiment, the plurality of separate chips of the stacked chip structure may be at least one of the same kind or different kinds.

In one embodiment, the first region of the flexible circuit substrate may include a mounting region on which the stacked chip structure is mounted, and the second region of the flexible circuit substrate may include a folding region which is folded. In one embodiment, at least one of the plurality of separate chips of the stacked chip structure may include a chip bump and the flexible circuit substrate may include a connecting pad. In another embodiment, the connecting pad may be electrically connected to the at least one chip bump by folding the folding region of the flexible circuit substrate.

According to another aspect of the inventive concepts, there is provided a chip-stacked semiconductor package including: a flexible circuit substrate including a mounting region on which a stacked chip structure is mounted, the stacked chip structure including a plurality of separate chips each including a chip bump, and a folding region having a connecting pad in a first side of the flexible circuit substrate, the connecting pad being electrically connected to at least one of the chip bumps of the separate chips by folding the folding region; a sealing portion sealing the flexible circuit substrate and the plurality of separate chips; and an external connecting terminal on a second side of the flexible circuit substrate and is connected to the connecting pad.

In one embodiment, an angle for folding the folding region may be at least one of an acute angle or an obtuse angle. In one embodiment, the folding region may be located at one side of the mounting region or both sides of the mounting region. In one embodiment, the connecting pad of the flexible circuit substrate may be connected to a chip bump of at least one of the plurality of separate chips by using a wire.

According to another aspect of the inventive concepts, there is provided a chip-stacked semiconductor package including: a stacked chip structure including a plurality of separate chips sequentially stacked; and a flexible circuit substrate having a first side, a second side, a mounting region and a folding region. The stacked chip structure is mounted on the first side of the flexible circuit substrate in the mounting region of the flexible circuit substrate and the folding region of the flexible circuit substrate is electrically connected to at least one of the plurality of separate chips. The chip-stacked semiconductor package further includes a sealing portion on the first side of the flexible circuit substrate sealing the stacked chip structure and the flexible circuit substrate and an external connecting terminal on the second side of the flexible circuit substrate.

In one embodiment, the folding region of the flexible circuit substrate may include a connecting pad in the first side of the flexible circuit substrate.

In another embodiment, at least one of the plurality of separate chips may include a chip bump and the connecting pad of the folding region may be electrically connected to the chip bump by folding the folding region of the flexible circuit substrate.

In one embodiment, the flexible circuit substrate and at least one of the plurality of separate chips of the stacked chip structure may be connected to each other by using a wire.

In one embodiment, the flexible circuit substrate may be electrically connected to at least one of the plurality of separate chips by folding at least one end portion the flexible circuit substrate.

BRIEF DESCRIPTION OF THE DRAWINGS

The foregoing and other features and advantages of the inventive concepts will be apparent from the more particular description of preferred aspects of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings, the thickness of layers and regions are exaggerated for clarity.

DETAILED DESCRIPTION OF THE EMBODIMENTS

Figure 1:
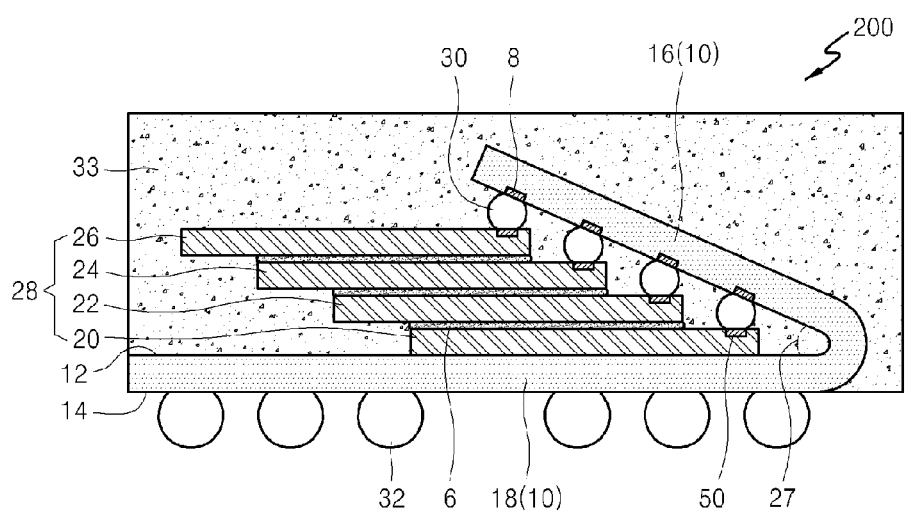
FIG. 1 is a cross-sectional view illustrating a chip-stacked semiconductor package according to an example embodiment of the inventive concepts.

Various example embodiments will be described more fully hereinafter with reference to the accompanying drawings, in which some example embodiments are shown. The present inventive concepts may, however, be embodied in many different forms and should not be construed as limited to the example embodiments set forth herein.

It will be understood that when an element, such as a layer, a region, a substrate, or a chip is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of example embodiments of the inventive concepts.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both orientations of above and below. The device may be otherwise oriented (rotated 90 degrees or at other orientations) and the spatially relative descriptors used herein interpreted accordingly.

The terminology used herein is for the purpose of describing example embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may include deviations in shapes that result, for example, from manufacturing. The inventive concepts may be implemented with separate embodiments or a combination of embodiments.

FIG. 1 is a cross-sectional view illustrating a chip-stacked semiconductor package 200 according to an example embodiment of the inventive concepts.

Referring to FIG. 1, the chip-stacked semiconductor package 200 includes a flexible circuit substrate 10. The flexible circuit substrate 10 includes a first side 12 and a second side 14. The flexible circuit substrate 10 is a substrate which may be bent. The flexible circuit substrate 10 may include at least one flexible insulating layer made of, for example, polyimide (PI), polyester, polyethylene napthalate (PEN), teflon, polyethylene terephthalate (PET), or other polymeric materials. In addition, the flexible circuit substrate 10 may include at least one flexible conductive layer made of, for example, copper, aluminum, or a metal alloy. The flexible conductive layer provides electrical connections between various interconnecting lines.

A stacked chip structure 28 is located on the first side 12 of the flexible circuit substrate 10, and a plurality of external connecting terminals 32 are installed on the second side 14 of the flexible circuit substrate 10. The plurality of external connecting terminals 32 may be electrically connected to the flexible circuit substrate 10. The plurality of external connecting terminals 32 may include solder balls.

The stacked chip structure 28 includes a plurality of separate chips 20, 22, 24, and 26 that are stacked on each other. The separate chips 20, 22, 24, and 26 are bonded to each other via an adhesive layer 6. The adhesive layer 6 may be an adhesive film. In FIG. 1, only four separate chips 20, 22, 24, and 26 are illustrated for convenience, but less or more than four separate chips may be stacked in the stacked chip 28. The separate chips 20, 22, 24, and 26 may be referred to as a first chip 20, a second chip 22, a third chip 24, and fourth chip 26. The first through fourth chips 20, 22, 24, and 26 may be of the same kind or different kinds.

The first through fourth chips 20, 22, 24, and 26 may be vertically stacked in a stair shape. A plurality of chip pads 50 are installed at sides of the separate first through fourth chips 20, 22, 24, and 26, which constitute the stacked chip structure 28, respectively, and a plurality of chip bumps 30 are installed on the plurality of chip pads 50, respectively. The chip bumps 30 may be a solder bump. In FIG. 1, the chip bumps 30 are exposed due to the stair shape of the separate first through fourth chips 20, 22, 24, and 26.

The flexible circuit substrate 10 may be divided into a mounting region 18 on which the stacked chip structure 28 is located, and a folding region 16 which may be folded and on which a plurality of connecting pads 8 are located. The stacked chip structure 28 is mounted on the mounting region 18 of the flexible circuit substrate 10. The folding region 16 of the flexible circuit substrate 10 may be folded to be electrically connected to the separate first through fourth chips 20, 22, 24, and 26. That is, the plurality of connecting pads 8 of the flexible circuit substrate 10 may be electrically connected to the plurality of the chip bumps 30 of the separate first through fourth chips 20, 22, 24, and 26, respectively. The plurality of external connecting terminals 32 may be electrically connected to the connecting pads 8.

An angle 27 for folding the flexible circuit substrate 10 may be an acute angle. In FIG. 1, the plurality of connecting pads 8 of the flexible circuit substrate 10 are connected to the plurality of chip bumps 30 of the separate first through fourth chips 20, 22, 24, and 26, respectively, but the flexible circuit substrate 10 may be connected only to some of the separate first through fourth chips 20, 22, 24, and 26 depending on the angle 27 and may be connected to the remaining ones from the separate first through fourth chips 20, 22, 24, and 26 by using wires (not shown).

A sealing portion 33 sealing the stacked chip structure 28 and the flexible circuit substrate 10 is formed on the first side 12 of the flexible circuit substrate. 10. The sealing portion 33 protects the stacked chip structure 28 and the flexible circuit substrate 10. In addition, the sealing portion 33 performs a function of insulating the separate first through fourth chips 20, 22, 24, and 26 from each other. That is, in the chip-stacked semiconductor package 200 according to an example embodiment of the inventive concepts, it is not necessary to form a separate coating on the separate first through fourth chips 20, 22, 24, and 26 to seal the separate first through fourth chips 20, 22, 24, and 26 from each other. The sealing portion 33 may be formed of a polymer such as a resin. For example, the sealing portion 33 may be formed of an epoxy molding compound (EMC).

In this manner, in the chip-stacked semiconductor package 200 according to an example embodiment of the inventive concepts, at least one of the separate first through fourth chips 20, 22, 24, and 26, which constitute the stacked chip structure 28, may be electrically connected to the flexible circuit substrate 10 by simply bending the flexible circuit substrate 10, without using any wires.

Thus, the chip-stacked semiconductor package 200 may have a small size, various functions, and a high capacity by stacking the separate first through fourth chips 20, 22, 24, and 26 which are of the same kind or different kinds.

Figure 2:
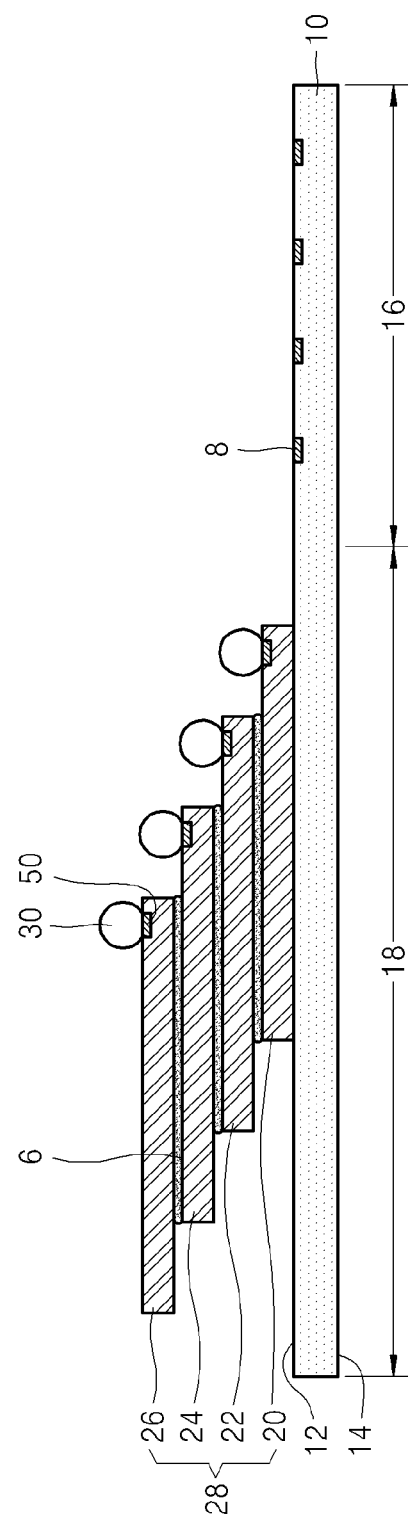
FIGS. 2 and 3 are cross-sectional views illustrating a method of manufacturing the chip-stacked semiconductor package of FIG. 1 in accordance with an example embodiment of the inventive concepts.
Figure 3:
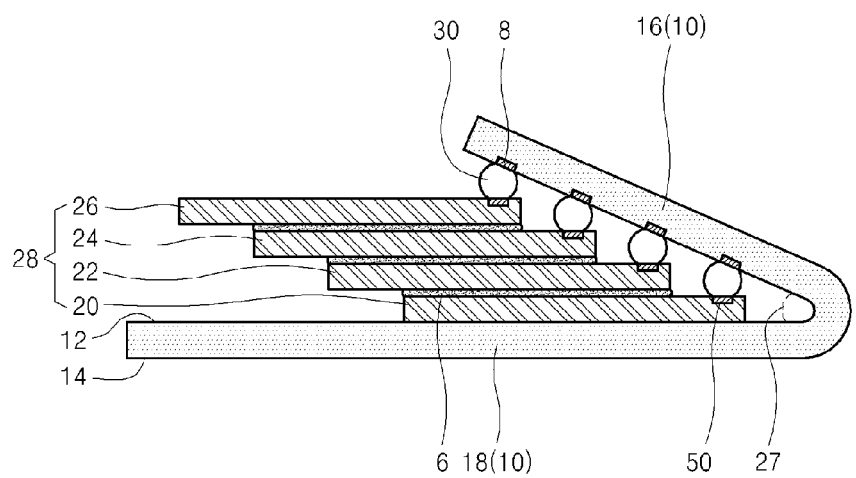

FIGS. 2 and 3 are cross-sectional views illustrating a method of manufacturing the chip-stacked semiconductor package of FIG. 1 in accordance with an example embodiment of the inventive concepts.

Referring to FIG. 2, as stated above, the flexible circuit substrate 10 having the first side 12 and the second side 14 is prepared. The flexible circuit substrate 10 may be divided into the mounting region 18 on which the stacked chip structure 28 is mounted and the folding region 16 of which one side is folded. The plurality of connecting pads 8 are installed in the folding region 16.

The stacked chip structure 28 including the plurality of separate first through fourth chips 20, 22, 24, and 26 is mounted on the mounting region 18. When vertically stacking the separate first through fourth chips 20, 22, 24, and 26, the separate first through fourth chips 20, 22, 24, and 26 may be stacked in a stair shape. The plurality of chip pads 50 and the plurality of chip bumps 30 are installed in sides of the separate first through fourth chips 20, 22, 24, and 26, which constitute the stacked chip structure 28, respectively. That is, the plurality of chip pads 50 and the plurality of chip bumps 30 are formed at one side of each of the separate first through fourth chips 20, 22, 24 and 26 that is exposed in the stair shape.

The chip pads 50 and the chip bumps 30 may be easily exposed by stacking the separate chips 20, 22, 24, and 26 in a stair shape. The chip pads 50 and the chip bumps 30 may be arranged so as to correspond to the connecting pads 8. An arrangement of the chip pads 50 is not limited hereto, as will be described in detail below.

Referring to FIG. 3, the connecting pads 8 of the flexible circuit substrate 10 are electrically connected to the chip bumps 30 of the separate first through fourth chips 20, 22, 24, and 26, respectively, by folding the folding region 16 of the flexible circuit substrate 10. The angle 27 for folding the flexible circuit substrate 10 may be an acute angle. As illustrated in FIG. 1, the chip-stacked semiconductor package 200 is completed by forming the sealing portion 33 sealing the stacked chip structure 28 and the flexible circuit substrate 10 on the first side 12 of the flexible circuit substrate 10.

Figure 4:
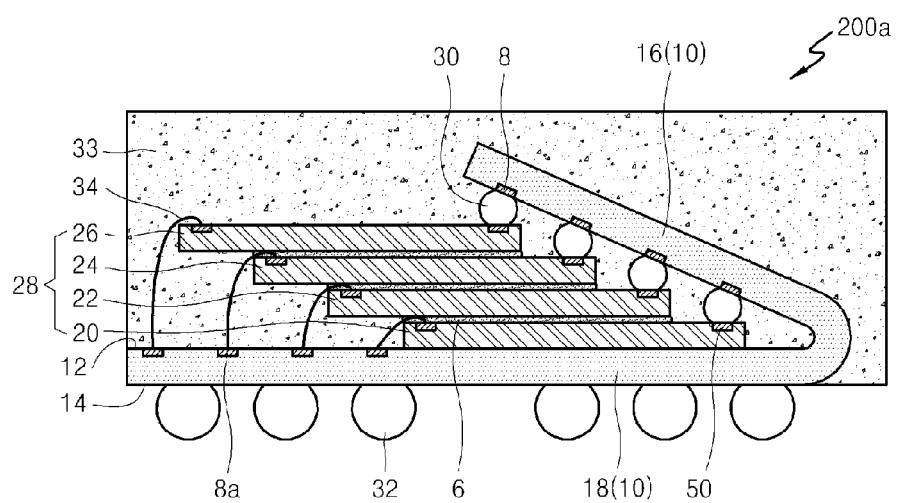
FIG. 4 is a cross-sectional view illustrating a chip-stacked semiconductor package according to an example embodiment of the inventive concepts.

FIG. 4 is a cross-sectional view illustrating a chip-stacked semiconductor package 200a according to an example embodiment of the inventive concepts.

The chip-stacked semiconductor package 200a of FIG. 4 is the same as the chip-stacked semiconductor package 200 of FIG. 1 except for wires 34 connecting the stacked chip structure 28 to the flexible circuit substrate 10.

As illustrated in FIG. 4, a folding region 16, which is located in one side of the flexible circuit substrate 10, may be folded and, thus, be electrically connected to a plurality of separate first through fourth chips 20, 22, 24, and 26. The plurality of separate first through fourth chips 20, 22, 24, and 26, which constitute the stacked chip structure 28, may be connected to a plurality of connecting pads 8a on a mounting region 18 which is located in the other side of the flexible circuit substrate 10 than the folding region 16, with the wires 34, for example, gold wires. A plurality of chip pads 50 which are located in one surface of the separate first through fourth chips 20, 22, 24, and 26 may be connected to the plurality of connecting pads 8a using the wires 34.

Adhesive layers 6 may provide connecting spaces when connecting the separate first through fourth chips 20, 22, 24, and 26 to the flexible circuit substrate 10 with the wires 34. In the case where the connecting spaces are small, dummy bumps (not shown) may be further included between the separate first through fourth chips 20, 22, 24, and 26. In FIG. 4, all of the separate first through fourth chips 20, 22, 24, and 26 are connected to the flexible circuit substrate 10 using the wires 34. However, in an alternative example embodiment, only some of the separate first through fourth chips 20, 22, 24, and 26 may be connected to the flexible circuit substrate 10 with the wires 34.

In the chip-stacked semiconductor package 200a, the connecting pads 8, which are located in the folding region 16 of the flexible circuit substrate 10, may be directly connected to chip bumps 30 of the separate first through fourth chips 20, 22, 24, and 26, respectively, and, in addition, the flexible circuit substrate 10 may be connected to the separate first through fourth chips 20, 22, 24, and 26 with the wires 34.

Figure 5:
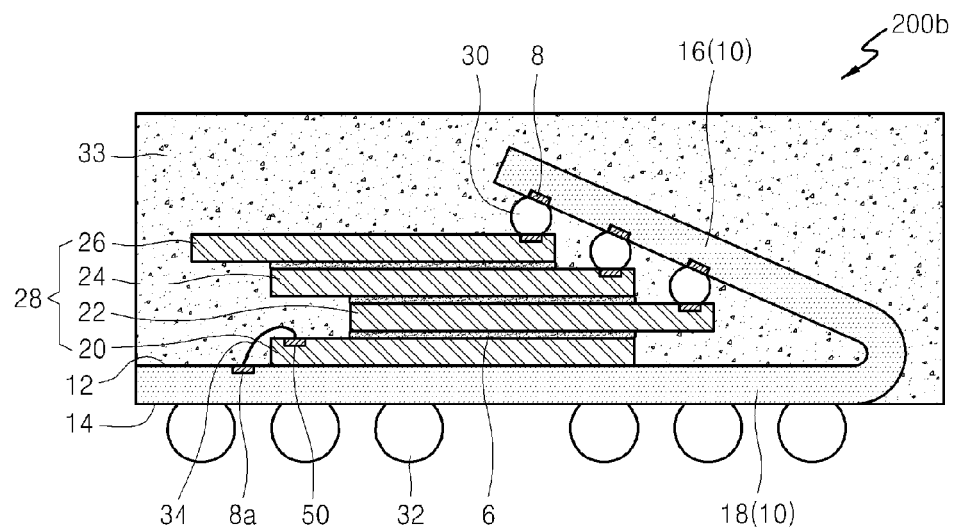
FIGS. 5 through 11 are cross-sectional views each illustrating a chip-stacked semiconductor package according to an embodiment of the inventive concepts.

FIG. 5 is a cross-sectional view illustrating a chip-stacked semiconductor package 200b according to an example embodiment of the inventive concepts.

The chip-stacked semiconductor package 200b of FIG. 5 is the same as the chip-stacked semiconductor package 200 of FIG. 1 except for a wire 34 connecting a first chip 20 to a flexible circuit substrate 10 by making a vertical stack arrangement of the first chip 20 of a plurality of separate first through fourth chips 20, 22, 24, and 26 be different from that of the chip-stacked semiconductor package 200 of FIG. 1.

As illustrated in FIG. 5, a stacked chip structure 28 is mounted on a mounting region 18 of the flexible circuit substrate 10, and a first side of the first chip 20 may be connected to a connecting pad 8a of the flexible circuit substrate 10 with the wire 34 by exposing the side of the first chip 20. The first side of the first chip 20 is exposed and the second side of the first chip 20 is covered by the second chip 22. Only second through fourth chips 22, 24, and 26, which are part of the stacked chip structure 28, are stacked in a stair shape adjacent to the folding region 16, and are electrically connected to connecting pads 8 of the folding region 16 of the flexible circuit substrate 10. That is, the first chip 20 is not formed in the stair shape.

Figure 6:
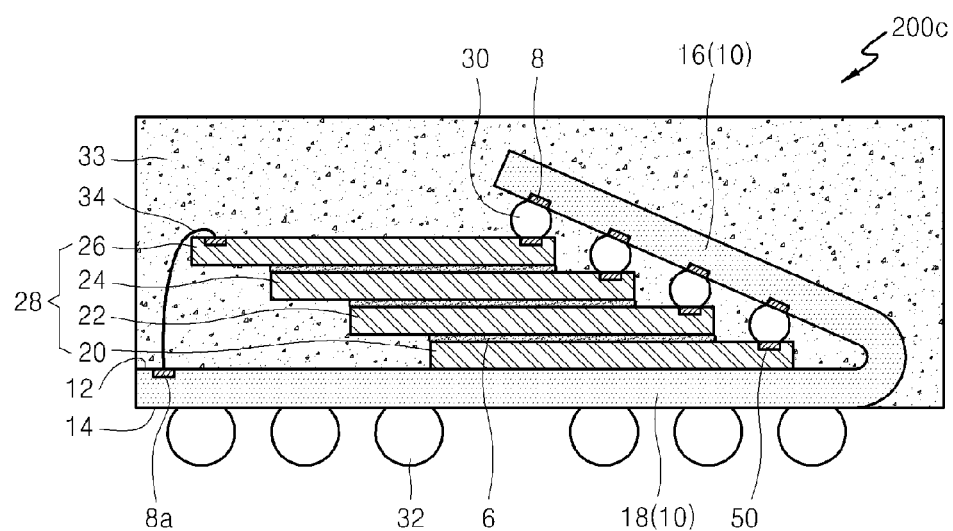

FIG. 6 is a cross-sectional view illustrating a chip-stacked semiconductor package 200c according to an example embodiment of the inventive concepts.

The chip-stacked semiconductor package 200c of FIG. 6 is the same as the chip-stacked semiconductor package 200 of FIG. 1 except for a wire 34 connecting a fourth chip 26 to a flexible circuit substrate 10.

As illustrated in FIG. 6, the fourth separate chip 26 may be connected to a connecting pad 8a of the flexible circuit substrate 10 with the wire 34. A chip pad 50 which is located in one surface of the fourth separate chip 26 may be connected to the connecting pad 8a using the wire 34. First through fourth chips 20, 22, 24, and 26, which constitute the stacked chip structure 28, are stacked in a stair shape adjacent to the folding region 16, and are electrically connected to connecting pads 8 of a folding region 16 of the flexible circuit substrate 10.

Figure 7:
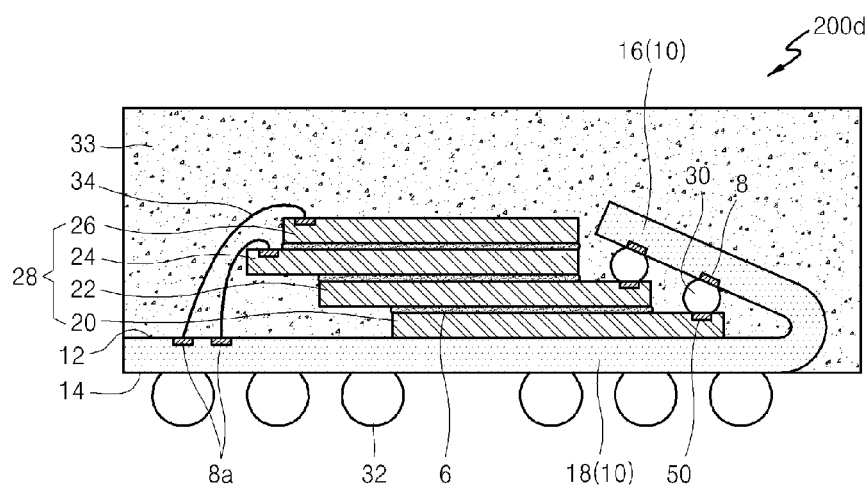

FIG. 7 is a cross-sectional view illustrating a chip-stacked semiconductor package 200d according to an example embodiment of the inventive concepts.

The chip-stacked semiconductor package 200d of FIG. 7 is the same as the chip-stacked semiconductor package 200 of FIG. 1 except for wires 34 connecting the third chip 24 and the fourth chip 26 to a flexible circuit substrate 10 34 and only a first chip 20 and a second chip 22 being electrically connected to connecting pads 8 of the folding region 16 of the flexible circuit substrate 10.

As illustrated in FIG. 7, a stacked chip structure 28 is mounted on a mounting region 18 of the flexible circuit substrate 10, and the third and fourth chips 24 and 26 may be connected to the connecting pads 8a of the mounting region 18 of the flexible circuit substrate 10 with the wires 34. Only the first and second chips 20 and 22 are stacked in a stair shape adjacent to the folding region 16, and are electrically connected to connecting pads 8 of the folding region 16 of the flexible circuit substrate 10. That is, the first and fourth chips 24 and 26 are not stacked in a stair shape with the first and second chips 20 and 22 and are not connected to the connecting pads 8 of the folding region 16 of the flexible circuit substrate 10. The third and fourth chips 24 and 26 are stacked in a stair shape in a direction opposite to the first and second chips 20 and 22.

In addition, in the chip-stacked semiconductor packages 200, 200a, 200b, 200c, and 200d of FIGS. 4 through 7, at least one of the separate first through fourth chips 20, 22, 24, and 26 is stacked to cross the other ones of the separate first through fourth chips 20, 22, 24, and 26 on the flexible circuit substrate 10. Accordingly, in the chip-stacked semiconductor packages 200, 200a, 200b, 200c, and 200d of FIGS. 4 through 7, the flexible circuit substrate 10 may be freely electrically connected to the separate first through fourth chips 20, 22, 24, and 26, regardless of positions of chip pads 50 of the separate first through fourth chips 20, 22, 24, and 26.

Figure 8:
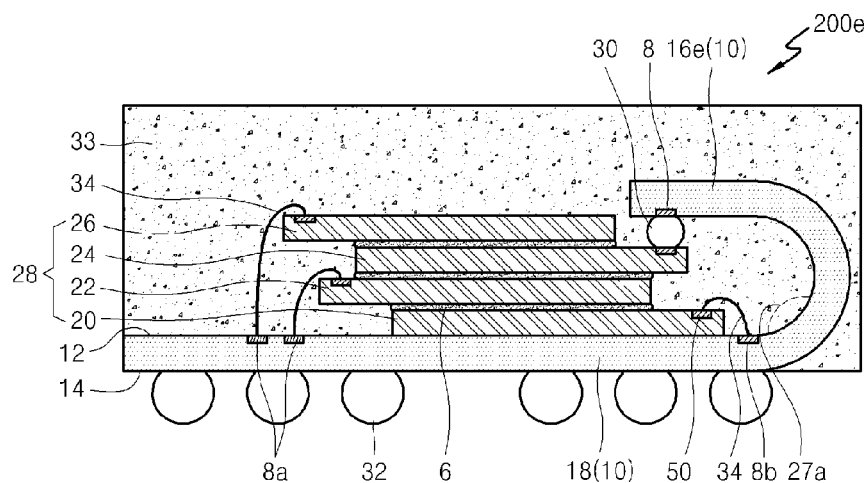

FIG. 8 is a cross-sectional view illustrating a chip-stacked semiconductor package 200e according to an example embodiment of the inventive concepts.

In the chip-stacked semiconductor package 200e of FIG. 8, a connecting pad 8 is connected to the third chip 24 by bending a folding region 16e of a flexible circuit substrate 10. In this example embodiment, the folding region 16e, in a different manner from those of the previous embodiments, is folded in an oval form and then the connecting pad 8 is connected to a chip bump 30. That is, an angle 27a for folding the flexible circuit substrate 10 may be an obtuse angle. If the folding region 16e is folded in the oval form and a surface of at least one of the separate first through fourth chips 20, 22, 24, and 26 is exposed, the connecting pad 8 may be connected to the at least one chip.

The first chip 20 may be connected to a connecting pad 8b, which is located in one side of a mounting region 18 of the flexible circuit substrate 10, with wire 34. The second chip 22 and the fourth chip 26 may be connected to a connecting pad 8a, which is located in the other side of the mounting region 18 of the flexible circuit substrate 10, with the wires 34.

Accordingly, in the chip-stacked semiconductor package 200e of FIG. 8, the connecting pad 8, which is located in the folding region 16e of the flexible circuit substrate 10, may be directly connected to a chip bump 30 of the third chip 24 and, in addition, the flexible circuit substrate 10 may be connected to the separate first, second, and fourth chips 20, 22, and 26 with the wires 34.

Figure 9:
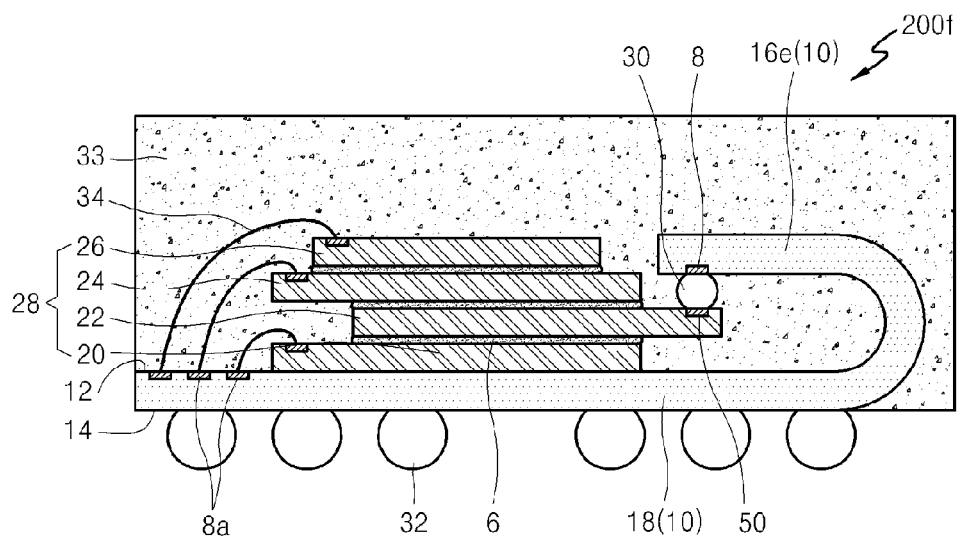

FIG. 9 is a cross-sectional view illustrating a chip-stacked semiconductor package 200f according to an example embodiment of the inventive concepts.

The chip-stacked semiconductor package 200f of FIG. 9 is the same as the chip-stacked semiconductor package 200e of FIG. 8 except for a connecting pad 8 being connected to a second chip 22 by bending a folding region 16e of a flexible circuit substrate 10 and connecting separate first, third, and fourth chips 20, 24 and 26 to connecting pads 8a which are located in one side of the flexible circuit substrate 10 with wires 34.

The connecting pad 8 is connected to the second chip 22 by bending the folding region 16e of the flexible circuit substrate 10. The folding region 16e, similar to that of FIG. 8, is folded in an oval form and then the connecting pad 8 is connected to a chip bump 30. The separate first, third, and fourth chips 20, 24, and 26 may be connected to connecting pads 8a which are located in one side of a mounting region 18 of the flexible circuit substrate 10 with the wires 34.

Figure 10:
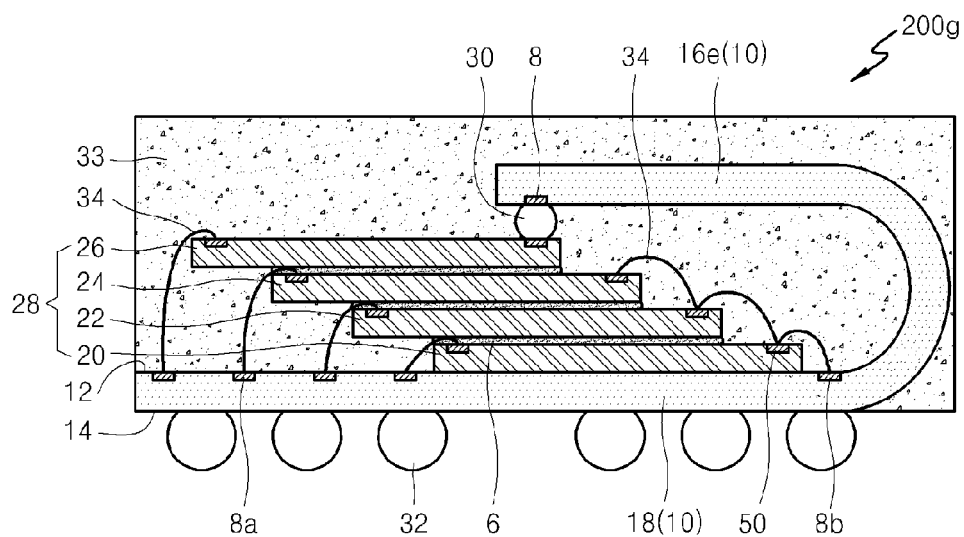

FIG. 10 is a cross-sectional view illustrating a chip-stacked semiconductor package 200g according to an example embodiment of the inventive concepts.

In the chip-stacked semiconductor package 200g of FIG. 10, a connecting pad 8 is connected to a fourth chip 26 by bending a folding region 16e of a flexible circuit substrate 10. In addition, the separate first through fourth chips 20, 22, 24, and 26 are connected to connecting pads 8a which are located in one side of the flexible circuit substrate 10, and the separate first through third chips 20, 22, and 24 are connected to a connecting pad 8b which is located in the other side of the flexible circuit substrate 10.

The connecting pad 8 is connected to the fourth chip 26 by bending the folding region 16e of the flexible circuit substrate 10. The folding region 16e, similar to that of FIG. 8, is folded in an oval form and then the connecting pad 8 is connected to a chip bump 30.

In the chip-stacked semiconductor packages 200e, 200f, and 200g of FIGS. 8 through 10, as stated above, the flexible circuit substrate 10 may be freely electrically connected to the separate first through fourth chips 20, 22, 24, and 26, regardless of positions of chip pads 50 of the separate first through fourth chips 20, 22, 24, and 26.

Figure 11:
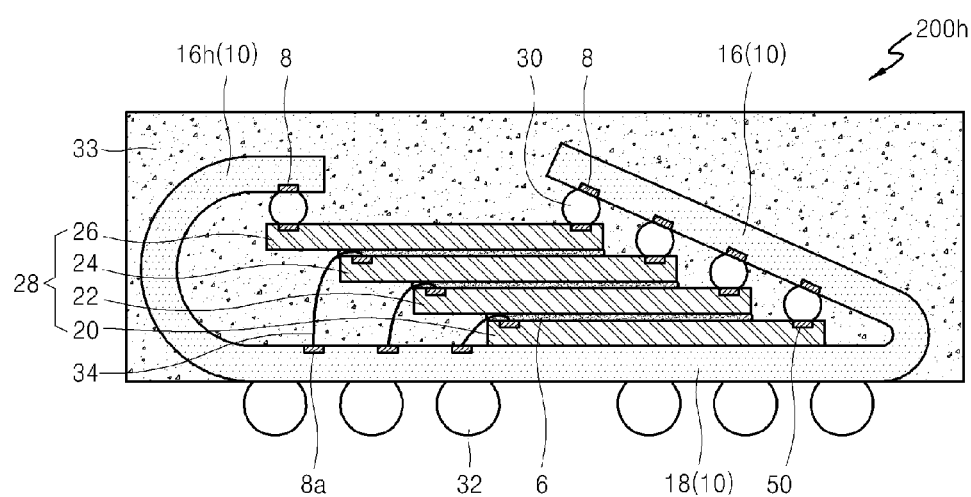

FIG. 11 is a cross-sectional view illustrating a chip-stacked semiconductor package 200h according to an example embodiment of the inventive concepts.

In the chip-stacked semiconductor package 200h of FIG. 11, the connecting pads 8 are connected to the chip bumps 30 of the separate first through fourth chips 20, 22, 24, and 26 by bending the folding region 16 of the flexible circuit substrate 10. The folding region 16 of the flexible circuit substrate 10, as stated above, is folded at an acute angle.

In addition, another connecting pad 8 is connected to another chip bump 30 of the fourth chip 26 by bending a folding region 16h of the other side of the flexible circuit substrate 10. The folding region 16h of the other side of the flexible circuit substrate 10, as stated above, is folded in an oval form. Accordingly, in the chip-stacked semiconductor package 200h of FIG. 11, the separate first through fourth chips 20, 22, 24, and 26 are electrically connected to the flexible circuit substrate 10 by folding both end side portions of the flexible circuit substrate 10. In addition, chip pads 50 of one side of each of the separate first through third chips 20, 22, and 24 may be connected to connecting pads 8a of the mounting region 18 of the flexible circuit substrate 10 with wires 34.

Accordingly, in the chip-stacked semiconductor package 200h of FIG. 11, the connecting pads 8 which are located in the folding regions 16 and 16h of the flexible circuit substrate 10 may be directly connected to the chip bumps 30 of the stacked chip structure 28, and, in addition, the connecting pads 8a which are located on the mounting region 18 of the flexible circuit substrate 10 may be connected to the separate first through third chips 20, 22, and 24, with the wires 34. In addition, in the chip-stacked semiconductor package 200h of FIG. 11, the flexible circuit substrate 10 may be freely electrically connected to the separate first through fourth chips 20, 22, 24, and 26, regardless of positions of chip pads 50 of the separate first through fourth chips 20, 22, 24, and 26.

Figure 12:
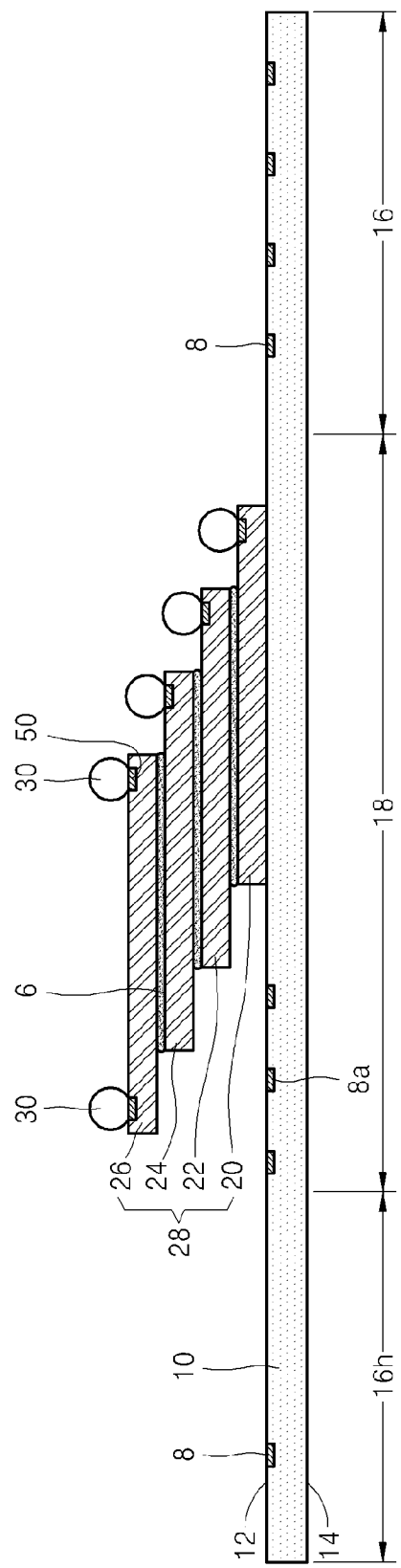
FIGS. 12 and 13 are cross-sectional views illustrating a method of manufacturing the chip-stacked semiconductor package of FIG. 11 in accordance with an example embodiment of the inventive concepts.
Figure 13:
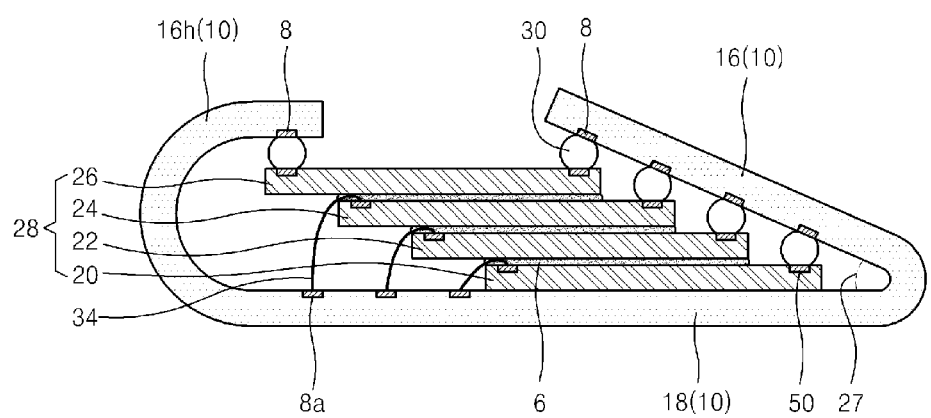

FIGS. 12 and 13 are cross-sectional views illustrating a method of manufacturing the chip-stacked semiconductor package of FIG. 11 in accordance with an example embodiment of the inventive concepts.

Referring to FIG. 12, a flexible circuit substrate 10 having a first side 12 and a second side 14 is prepared. The flexible circuit substrate 10 may be divided into a mounting region 18 on which a stacked chip structure 28 is mounted and a folding region 16 in one side of the mounting region 18 and a folding region 16h in the other side of the mounting region 18. A plurality of connecting pads 8 are installed in the folding region 16 and a plurality of connecting pads 8a are installed in the mounting region 18.

A stacked chip structure 28 including a plurality of separate first through fourth chips 20, 22, 24, and 26 is mounted on the mounting region 18. When vertically stacking the separate first through fourth chips 20, 22, 24, and 26, the separate first through fourth chips 20, 22, 24, and 26 are stacked in a stair shape. A plurality of chip pads 50 are located in one side of the separate first through fourth chips, respectively, and a plurality of chip pads 50 are located in the other sides of the separate first through fourth chips, respectively. A plurality of chip bumps 30 are installed on the one side of the separate first through fourth chips 20, 22, 24, and 26, which are part of the stacked chip structure 28, respectively, and a chip bump 30 is installed on the other side of the fourth chip 26. The bumps 30 may be easily exposed by stacking the separate first through fourth chips 20, 22, 24, and 26 in the stair shape.

Referring to FIG. 13, a plurality of chip pads 50, which are located in the other side surfaces of the separate first through third chips 20, 22, and 24, respectively, are connected to the plurality of connecting pads 8a of the mounting region 18 of the flexible circuit substrate 10, respectively, with wires 34. The plurality of connecting pads 8 of the folding region 16 of the flexible circuit substrate 10 are electrically connected to the plurality of chip bumps 30 of the separate first through fourth chips 20, 22, 24, and 26, respectively, by folding the folding region 16 of the flexible circuit substrate 10. An angle 27 for folding the folding region 16 of the flexible circuit substrate 10 may be an acute angle. Continuously, an additional connecting pad 8 of the folding region 16h of the flexible circuit substrate 10 is electrically connected to an additional chip bump 30 of the fourth chip 26 by folding the folding region 16h of the flexible circuit substrate 10. In this example embodiment, an angle for folding the flexible circuit substrate 10 may be an obtuse angle.

Continuously, as illustrated in FIG. 11, the chip-stacked semiconductor package 200h is completed by forming a sealing portion 33 sealing the stacked chip structure 28 and the flexible circuit substrate 10 on the first side 12 of the flexible circuit substrate 10.

Figure 14A:
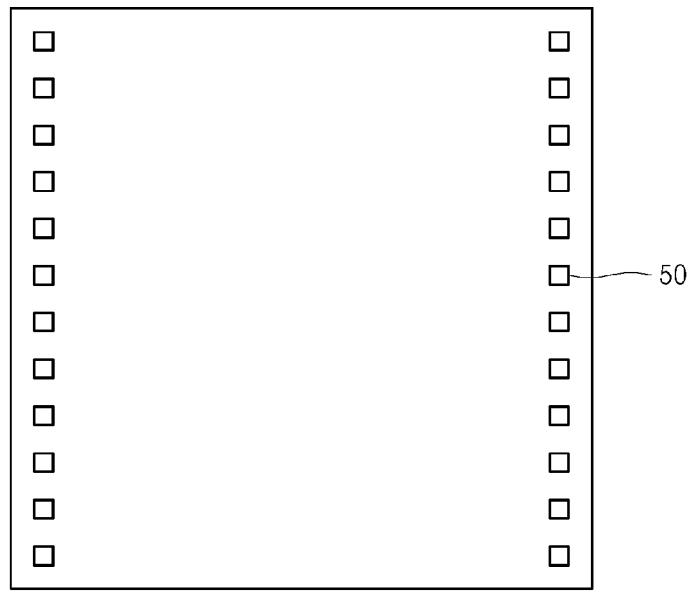
FIGS. 14A and 14B are plan views each illustrating a chip pad arrangement of a separate chip of a chip-stacked semiconductor package according to an example embodiment of the inventive concepts.
Figure 14B:
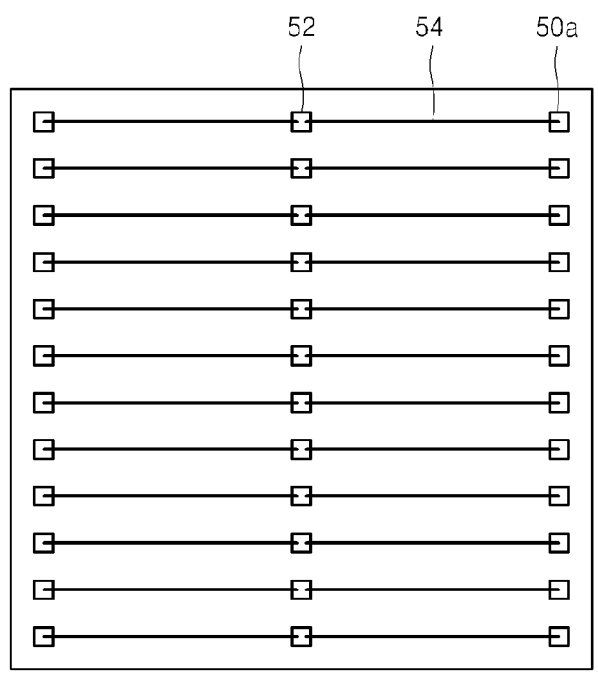

FIGS. 14A and 14B are plan views each illustrating a chip pad arrangement of a separate chip of a chip-stacked semiconductor package according to an example embodiment of the inventive concepts.

As illustrated in FIG. 14A, the chip pad arrangement of the separate chip of the chip-stacked semiconductor package may include a plurality of edge pads 50. The edge pads 50 are arranged along edges of the separate chip.

As illustrated in FIG. 14B, the chip pad arrangement of the separate chip of the chip-stacked semiconductor package may include a plurality of center pads 52. The center pads 52 are arranged in the center portion of the separate chip. The plurality of center pads 52 may be rearranged with a plurality of re-wiring pads 50a which are formed in edges of the separate chip by using re-wiring layers 54. In the present specification, chip pads are the edge pads 50, the center pads 52, and the re-wiring pads 50a.

Figure 15A:
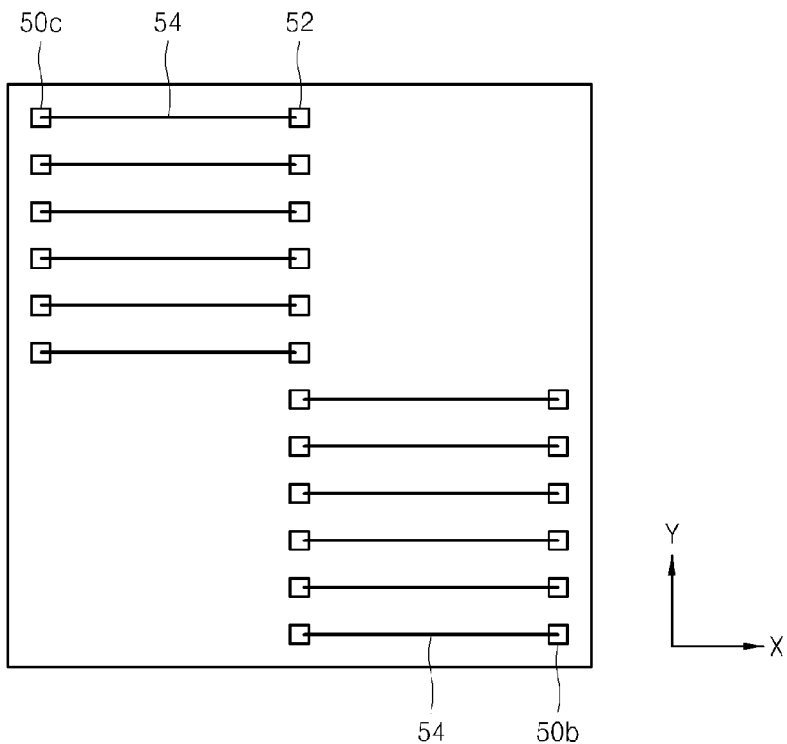
FIGS. 15A and 15B are plan views respectively illustrating a chip pad arrangement of a separate chip of a chip-stacked semiconductor package according to an example embodiment of the inventive concepts.
Figure 15B:
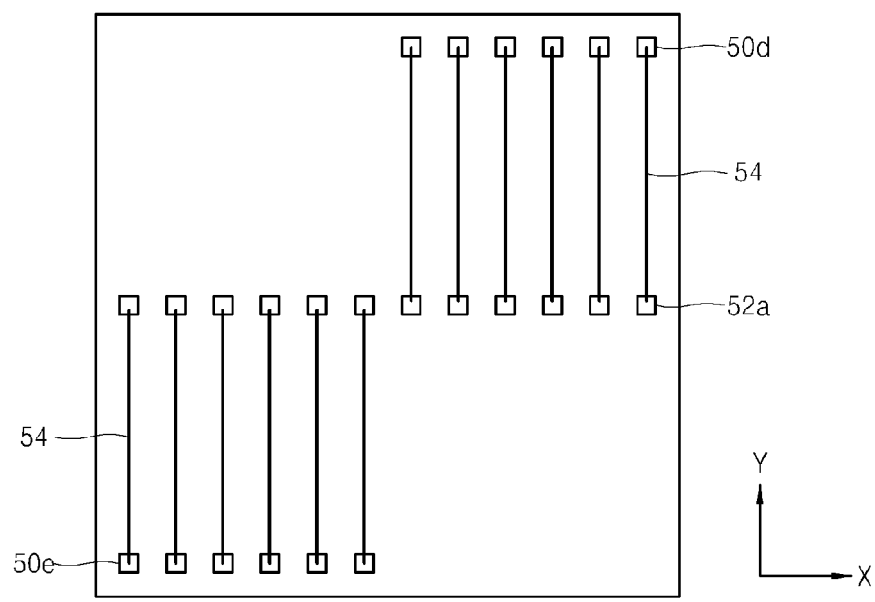

FIGS. 15A and 15B are plan views each illustrating a chip pad arrangement of a separate chip of a chip-stacked semiconductor package according to an example embodiment of the inventive concepts.

As illustrated in FIG. 15A, the chip pad arrangement of the separate chip of the chip-stacked semiconductor package may include a plurality of center pads 52. The center pads 52, as stated above, are arranged in a Y-axis direction in the center portion of the separate chip. The plurality of center pads 52 may be rearranged with a plurality of re-wiring pads 50b and 50c which are formed in edges of the separate chip by using re-wiring layers 54. In particular, in FIG. 15A, some of the plurality of center pads 52 may be rearranged with a plurality of re-wiring pads 50b by re-wiring under the right side of the separate chip, and the other ones of the plurality of center pads 52 may be rearranged with a plurality of re-wiring pads 50c by re-wiring over the left side of the separate chip.

In addition, as illustrated in FIG. 15B, the chip pad arrangement of the separate chip of the chip-stacked semiconductor package may include a plurality of center pads 52a. The center pads 52a of FIG. 15B, in a manner different from the center pads 52 of FIG. 15A, may be arranged in an X-axis direction. The plurality of center pads 52a may be rearranged with a plurality of re-wiring pads 50d and 50e which are formed in edges of the separate chip by using re-wiring layers 54. In particular, in FIG. 15B, some of the plurality of center pads 52a may be rearranged with a plurality of re-wiring pads 50d by re-wiring them on the upper side of the separate chip, and the remaining ones of the plurality of center pads 52a may be rearranged with a plurality of re-wiring pads 50e by re-wiring them below the lower side of the separate chip. Chip pads as described herein are the edge pads 50, the center pads 52, and the re-wiring pads 50a, 50b, 50c, and 50e.

When forming a chip-stacked semiconductor package by stacking a plurality of separate chips according to the inventive concepts, a chip pad arrangement like in FIGS. 15A and 15B may be used between adjacent separate chips. For example, chip pad arrangements of the first and second chips 20 and 22 stacked on the flexible circuit substrate 10 may be constituted like in FIGS. 15A and 15B. Thus, the substrate 10 may be easily electrically connected to the separate chips 20, 22, 24, and 26 in various forms.

Figure 16:
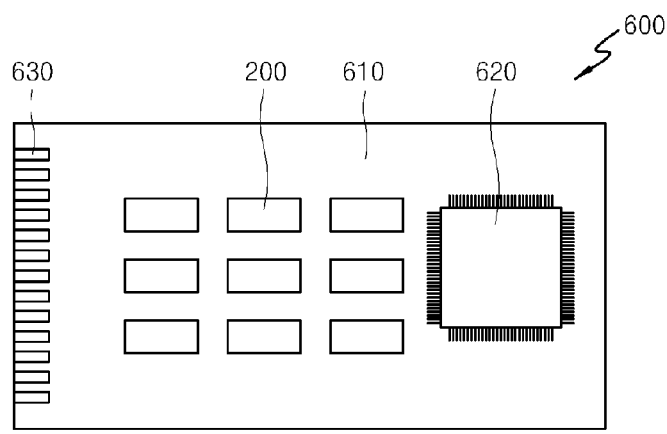
FIG. 16 is a schematic diagram illustrating a configuration of a package module using a chip-stacked semiconductor package according to an example embodiment of the inventive concepts.

FIG. 16 is a schematic diagram illustrating a configuration of a package module using a chip-stacked semiconductor package 200 according to an example embodiment of the inventive concepts. The chip-stacked semiconductor package may be any of the chip-stacked semiconductor packages 200, 200a-200h described herein.

The chip-stacked semiconductor package 200 according to the inventive concepts may be applied to a package module 600. In the package module 600, a plurality of chip-stacked semiconductor packages 200 are attached to a module substrate 610. A logic package 620 is attached to one side of the package module 600, and a plurality of external connecting pads 630 are located at the other side of the package module 600. The chip-stacked semiconductor package 200 according to the inventive concepts is not limited to the application to the package module 600 of FIG. 16 and may be applied to various package modules.

Figure 17:
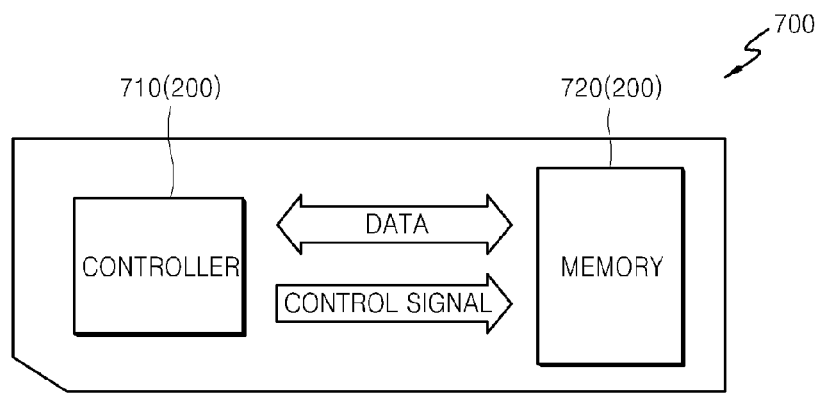
FIG. 17 is a schematic block diagram illustrating a card using a chip-stacked semiconductor package according to an example embodiment of the inventive concepts.

FIG. 17 is a schematic diagram illustrating a card 700 using a chip-stacked semiconductor package 200 according to an example embodiment of the inventive concepts.

Referring to FIG. 17, the chip-stacked semiconductor package 200, for example, a controller 710 and/or a memory 720 may be applied to the card 700. The card 700 may be, for example, a memory stick card, a smart media (SM) card, a secure digital (SD) card, a mini SD card, or a multi media card (MMC). The memory 720 may be a flash memory, a phase change random access memory (PRAM), or the other type of non-volatile memory.

The card 700 includes the controller 710 and the memory 720. In the card 700, the controller 710 and the memory 720 may be disposed to transmit/receive electric signals to/from each other. The controller 710 transmits a control signal to the memory 720, and data is transmitted and received between the controller 710 and the memory 720. For example, when the controller 710 transmits a command to the memory 720, the memory 720 may transmit data. The controller 710 and/or the memory 720 may include a chip-stacked semiconductor package according to one of the example embodiments of the inventive concepts. The chip-stacked semiconductor package may be any of the chip-stacked semiconductor packages 200, 200a-200h described herein. The memory 720 may include memory arrays (not shown) or memory array banks (not shown).

The controller 710 and the memory 720, which constitute the card 700 according to the inventive concepts, may adopt the chip-stacked semiconductor package 200 such as that illustrated above. In this case, the card 700 may enlarge a memory capacity and include the controller 710 having various functions. In addition, a thickness of the card 700 may be thin and lengths of interconnection lines in the card 700 may be short, and thus a performance of the card 700 may be improved.

Figure 18:
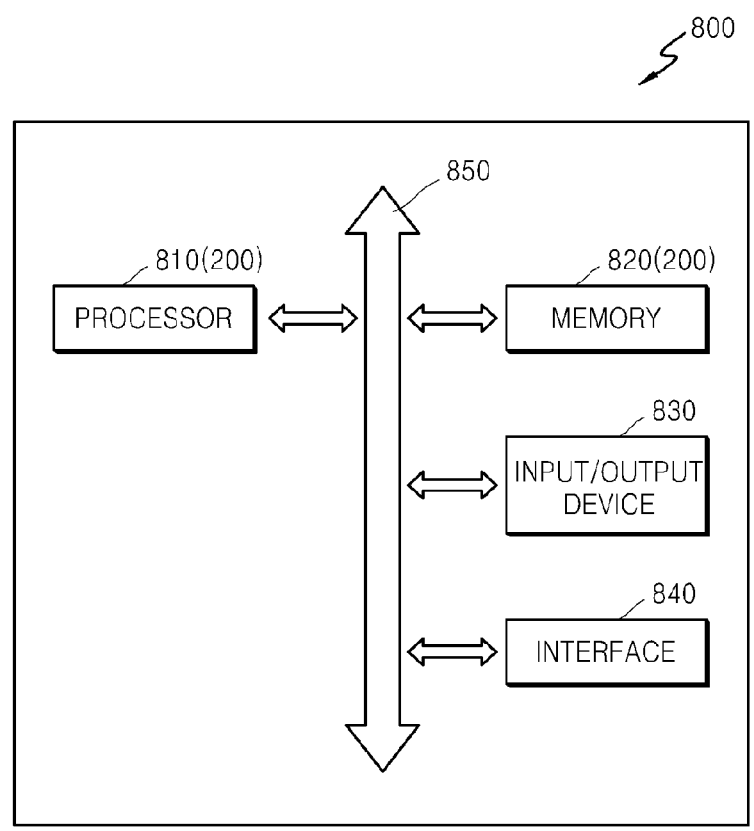
FIG. 18 is a schematic block diagram illustrating an electronic system including a chip-stacked semiconductor package according to an example embodiment of the inventive concepts.

FIG. 18 is a schematic block diagram illustrating an electronic system 800 including a chip-stacked semiconductor package 200 according to an example embodiment of the inventive concepts. The chip-stacked semiconductor package may be any of the chip-stacked semiconductor packages 200, 200a-200h described herein Referring to FIG. 18, the electronic system 800 may include a processor 810, a memory 820, an input/output device 830, and an interface 840. The electronic system 800 may be a mobile system or a system that transmits or receives data.

The mobile system may be a personal digital assistant (PDA), a portable computer, a web tablet, a wireless phone, a mobile phone, a digital music player, or a memory card.

The processor 810 executes a software program and controls the electronic system 800. The processor 810 may be a microprocessor, a digital signal processor, a microcontroller, or the like. The input/output device 830 may be used to input or output data of the electronic system 800.

The electronic system 800 is connected to an external apparatus, for example, a personal computer or a network, using the input/output device 830, to send/receive data to/from the external apparatus. The input/output device 830 may be a keypad, a keyboard, or a display. The memory 820 may store codes and/or data for operating the processor 810 and/or may store data processed by the processor 810. The processor 810, the memory 820, and the input/output device 830 transmit and receive data by using a communication channel, namely a bus 850.

The interface 840 may be a data transmission path between the electronic system 800 and an external apparatus. The processor 810, the input/output device 830, the memory 820, and the interface 840 may communicate with one another by the bus 850.

For example, the electronic system 800 may be used for a mobile phone, an MP3 player, a navigation system, a portable multimedia player (PMP), a solid state disk (SSD), or a household appliance.

In the electronic system 800, the chip-stacked semiconductor package 200 is installed in the processor 810 and the memory 820. That is, the processor 810 and the memory 820 may include a chip-stacked semiconductor package according to one of the embodiments of the inventive concepts. The chip-stacked semiconductor package may be any of the chip-stacked semiconductor packages 200, 200a-200h described herein In this example embodiment, the electronic system 800 may have various functions and also improve reliability thereof.

The foregoing is illustrative of example embodiments and is not to be construed as limiting thereof. Although example embodiments have been described, those of ordinary skill in the art will readily appreciate that many modifications are possible in the example embodiments without materially departing from the novel teachings and advantages of the example embodiments. Accordingly, all such modifications are intended to be included within the scope of the claims. Example embodiments are defined by the following claims, with equivalents of the claims to be included therein.

What is claimed is:

1. A chip-stacked semiconductor package comprising:
   a stacked chip structure comprising a plurality of separate chips stacked on each other;
   a flexible circuit substrate having the stacked chip structure mounted on a first side of the flexible circuit substrate in a first region of the flexible circuit substrate, and being electrically connected to at least one of the plurality of separate chips of the stacked chip structure by folding a second region of the flexible circuit substrate;
   a sealing portion sealing the stacked chip structure and the flexible circuit substrate; and
   an external connecting terminal on a second side of the flexible circuit substrate,
   wherein an angle for folding the second region of the flexible circuit substrate is at least one of an acute angle or an obtuse angle.

2. The chip-stacked semiconductor package of claim 1, wherein the flexible circuit substrate and at least one of the plurality of separate chips of the stacked chip structure are connected to each other by using a wire.

3. The chip-stacked semiconductor package of claim 1, wherein the plurality of separate chips of the stacked chip structure are bonded to each other with an adhesive layer.

4. The chip-stacked semiconductor package of claim 1, wherein the plurality of separate chips of the stacked chip structure are stacked in a stair shape on the first side of the flexible circuit substrate.

5. The chip-stacked semiconductor package of claim 1, wherein at least one of the plurality of separate chips of the stacked chip structure is stacked to cross the other ones of the plurality of separate chips on the flexible circuit substrate.

6. The chip-stacked semiconductor package of claim 1, wherein the flexible circuit substrate is electrically connected to at least one of the plurality of separate chips by folding both end portions of the flexible circuit substrate.

7. The chip-stacked semiconductor package of claim 6, wherein the flexible circuit substrate and at least one of the plurality of separate chips of the stacked chip structure are connected to each other by using a wire.

8. The chip-stacked semiconductor package of claim 1, wherein the plurality of separate chips of the stacked chip structure are at least one of the same kind or different kinds.

9. The chip-stacked semiconductor package of claim 1, wherein the first region of the flexible circuit substrate comprises a mounting region on which the stacked chip structure is mounted, and the second region of the flexible circuit substrate comprises a folding region which is folded.

10. The chip-stacked semiconductor package of claim 9, wherein at least one of the plurality of separate chips of the stacked chip structure comprises a chip bump and the flexible circuit substrate comprises a connecting pad.

11. The chip-stacked semiconductor package of claim 10, wherein the connecting pad is electrically connected to the at least one chip bump by folding the folding region of the flexible circuit substrate.

12. A chip-stacked semiconductor package comprising:
    a flexible circuit substrate comprising a mounting region on which a stacked chip structure is mounted, the stacked chip structure comprising a plurality of separate chips each comprising a chip bump, and a folding region having a connecting pad in a first side of the flexible circuit substrate, the connecting pad being electrically connected to at least one of the chip bumps of the separate chips by folding the folding region;
    a sealing portion sealing the flexible circuit substrate and the plurality of separate chips; and
    an external connecting terminal on a second side of the flexible circuit substrate and which is connected to the connecting pad,
    wherein an angle for folding the folding region is at least one of an acute angle or an obtuse angle.

13. The chip-stacked semiconductor package of claim 12, wherein the folding region is located at one side of the mounting region or both sides of the mounting region.

14. The chip-stacked semiconductor package of claim 12, wherein the connecting pad of the flexible circuit substrate is connected to a chip bump of at least one of the plurality of separate chips by using a wire.

15. A chip-stacked semiconductor package comprising:
    a stacked chip structure comprising a plurality of separate chips sequentially stacked;
    a flexible circuit substrate having a first side, a second side, a mounting region and a folding region, wherein the stacked chip structure is mounted on the first side of the flexible circuit substrate in the mounting region of the flexible circuit substrate and wherein the folding region of the flexible circuit substrate is electrically connected to at least one of the plurality of separate chips, the folding region being connected to at least one of the plurality of separate chips by folding the folding region;
    a sealing portion on the first side of the flexible circuit substrate sealing the stacked chip structure and the flexible circuit substrate; and
    an external connecting terminal on the second side of the flexible circuit substrate,
    wherein an angle for folding the folding region is at least one of an acute angle or an obtuse angle.

16. The chip-stacked semiconductor package of claim 15, wherein the folding region of the flexible circuit substrate comprises a connecting pad in the first side of the flexible circuit substrate.

17. The chip-stacked semiconductor package of claim 16, wherein at least one of the plurality of separate chips comprises a chip bump and wherein the connecting pad of the folding region is electrically connected to the chip bump by folding the folding region of the flexible circuit substrate.

18. The chip-stacked semiconductor package of claim 15, wherein the flexible circuit substrate and at least one of the plurality of separate chips of the stacked chip structure are connected to each other by using a wire.

19. The chip-stacked semiconductor package of claim 15, wherein the flexible circuit substrate is electrically connected to at least one of the plurality of separate chips by folding at least one end portion the flexible circuit substrate.

* * * * *